United States Patent [19]

Johnston

[11] 4,323,979
[45] Apr. 6, 1982

[54] CARTRIDGE AND BEZEL ASSEMBLY FOR A CALCULATOR

[75] Inventor: John N. Johnston, North Plainfield, N.J.

[73] Assignee: Litton Business Systems, Inc., Morris Plains, N.J.

[21] Appl. No.: 68,010

[22] Filed: Aug. 20, 1979

[51] Int. Cl.³ .............................................. G06F 1/00
[52] U.S. Cl. .................................. 364/708; 361/390; D18/11
[58] Field of Search ................ 364/708, 709; D14/40, D14/46; D18/1, 6, 7, 11; 361/390, 399; 235/483, 495, 419

[56] References Cited

U.S. PATENT DOCUMENTS

| | | | |
|---|---|---|---|
| 3,631,299 | 12/1971 | Meyer et al. | 361/399 |
| 4,084,242 | 4/1978 | Conti | 364/708 |
| 4,092,698 | 5/1978 | Brefka | 361/399 |
| 4,104,725 | 8/1978 | Rose et al. | D14/40 |
| 4,152,770 | 5/1979 | Olander, Jr. et al. | 364/709 |
| 4,176,315 | 11/1979 | Sunnarborg | 361/399 |

Primary Examiner—Errol A. Krass
Attorney, Agent, or Firm—Michael H. Wallach; Robert F. Rotella

[57] ABSTRACT

An electronic calculator utilizing a programmable read-only memory (PROM) cartridge for control of a number of the calculator functions is provided with a bezel which is snap-fit into a keyed opening in the calculator housing and guides a connector on the cartridge into simple and reliable electrical connection with a connector in the calculator. The bezel, which is simply and inexpensively constructed of plastic, has at least one bevelled outer surface to insure proper orientation of the bezel in the keyed opening and has at least one bevelled inner surface which cooperates with a corresponding bevelled outer surface on the cartridge to prevent improper orientation on the cartridge during insertion thereof into the bezel. The cartridge cover is also simply and inexpensively constructed of plastic, has self-aligning parts, and may be assembled by using a single screw.

11 Claims, 5 Drawing Figures

FIG. 4
FIG. 5
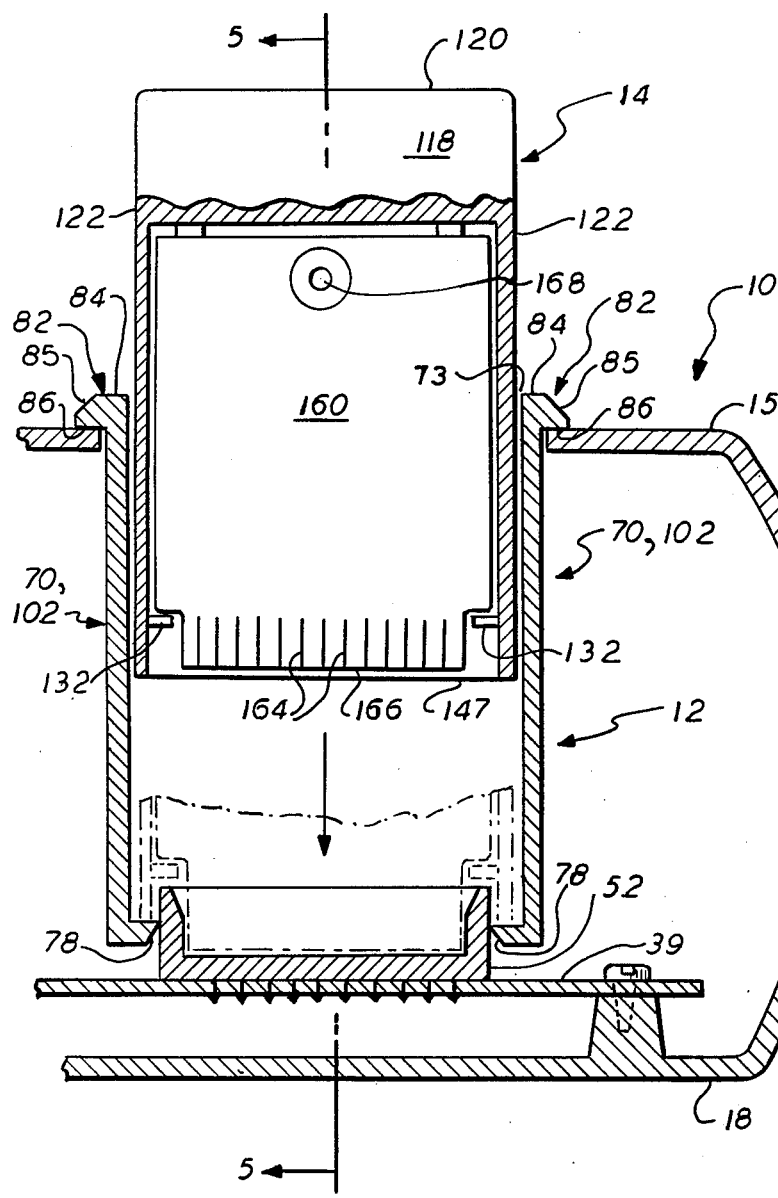
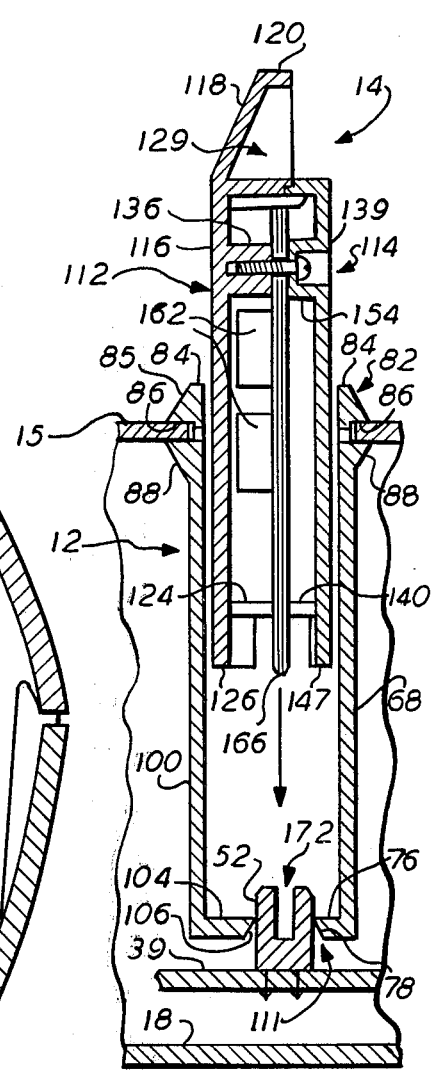

CARTRIDGE AND BEZEL ASSEMBLY FOR A CALCULATOR

BACKGROUND OF THE INVENTION

1. Field of the Invention

The present invention relates to an electronic calculator which utilizes a programmable read-only-memory ("PROM") cartridge for control of at least one of the calculator functions and, more particularly, to a PROM cartridge and bezel arrangement for an electronic desktop calculator.

2. Description of the Prior Art

Prior art cartridges containing electrical circuitry—for example, mounted on a printed circuit board—are often unduly bulky and unduly complicated and expensive to construct and assemble. Some such cartridges utilize female connectors which are bulkier than desired and often must be used in conjunction with pre-bent pins which must be hand soldered to a printed circuit board—an expensive and time consuming assembly step. Such cartridges may also include bevelled outer edges to insure proper orientation for insertion and a cavity disposed exteriorly of the housing for supporting the cartridge, for example with the fingers of one hand.

Other cartridges utilize printed circuit boards with male plug-in type connectors; however, the structure and assembly of even these cartridges is more complicated than desirable. Typically, the printed circuit board must be mounted in place and then a cover assembled to a housing base. Often, these cartridges include movable protective shields disposed within the cartridges.

Devices of the type discussed in the foregoing paragraphs are disclosed in Asher et al., U.S. Pat. No. 4,149,027, Wrabel et al., U.S. Pat. No. 3,668,476, Smith et al., U.S. Pat. No. 4,095,791, Owen, U.S. Pat. No. 3,506,877, Douglass et al., U.S. Pat. No. 4,012,672, Brefka, U.S. Pat. No. 4,092,698, and Gordon et al., U.S. Pat. No. 3,895,267.

SUMMARY OF THE INVENTION

The present invention is directed toward a calculator including a PROM cartridge which is insertable therein and a bezel which guides the PROM cartridge during insertion. The bezel, which is inexpensive and simply constructed of plastic, is provided with at least one bevelled outer edge and is insertable in only one orientation in an opening in the calculator housing into which the bezel is snap fit. The PROM cartridge cover, which is also simply and inexpensively constructed of plastic, is easily assembled with one screw and has self-aligning parts which, when assembled, support and align a printed circuit board. The PROM cartridge has at least one bevelled surface which cooperates with an inner surface of the bezel to insure proper orientation of the PROM cartridge during insertion thereof and the bezel aligns a connector on the printed circuit board in the cartridge for simple insertion in and reliable electrical connection to a connector mounted within the calculator housing.

BRIEF DESCRIPTION OF THE DRAWINGS

FIG. 4 is a cross-sectional view showing the PROM cartridge during insertion thereof into the bezel and calculator; and FIG. 5 is a cross-sectional view, taken along line 5—5 in FIG. 4, showing the PROM cartridge during insertion thereof into the bezel and calculator.

DESCRIPTION OF THE PREFERRED EMBODIMENT

Figure 1:
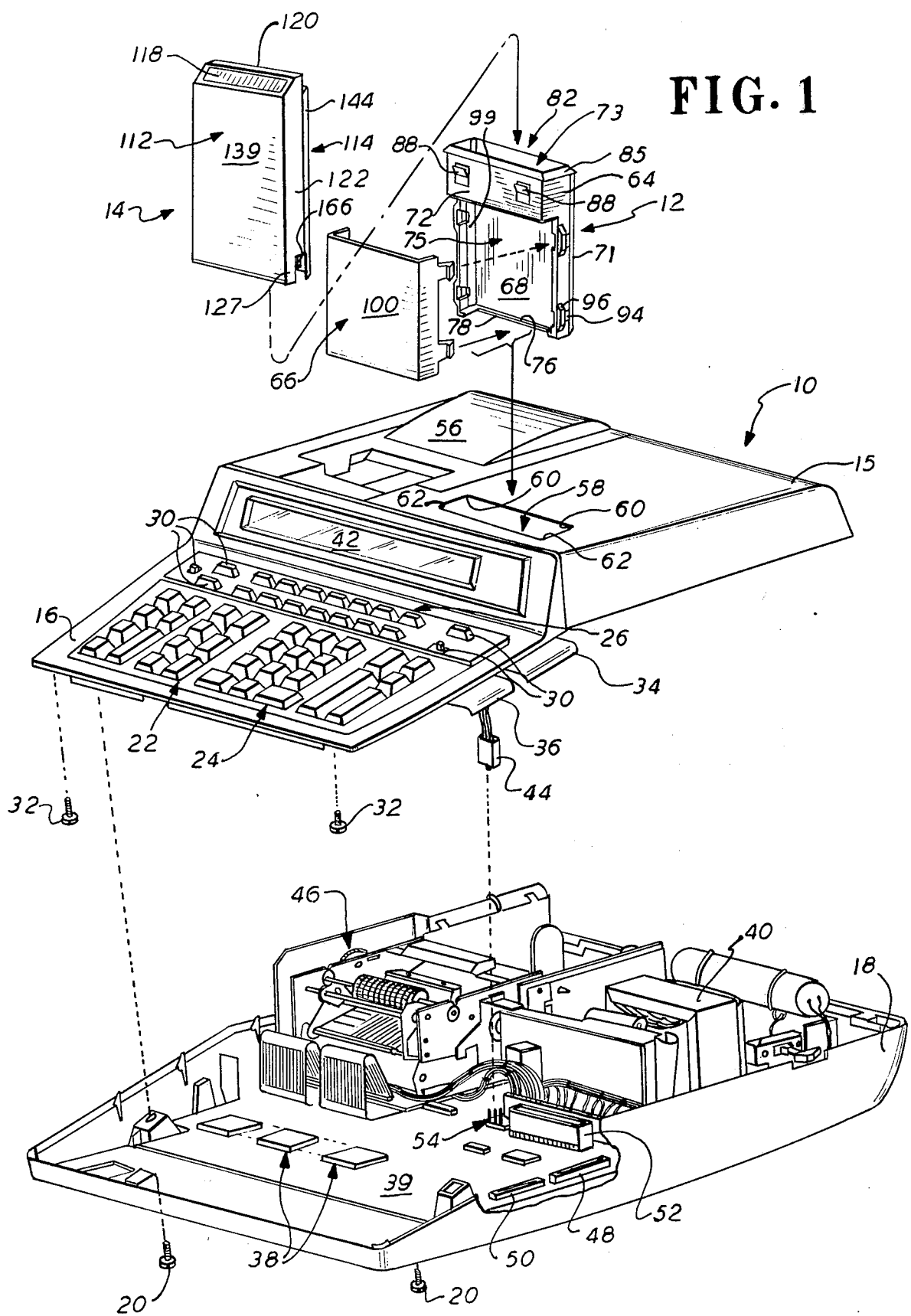
FIG. 1 is an exploded perspective view of a calculator incorporating a PROM cartridge and bezel arrangement constructed in accordance with the invention.

Referring now to FIG. 1, there is shown a calculator 10 including a bezel 12 and PROM cartridge 14 constructed in accordance with the present invention.

The calculator 10 includes a top cover 15 supported by suitable means on a keyboard frame 16 which is attached to a bottom cover 18 by a plurality of screws 20. A keyboard assembly 22, including a conventional calculator main keyboard 24, a plurality of PROM function keys 26 (which effect the execution of programs stored in the particular PROM cartridge used), a plurality of function keys 28 (which effect the execution of functions —e.g., percent change, markups, etc.—stored internally in the calculator 10), and a plurality of miscellaneous switching mechanisms 30, is secured to the keyboard frame 16 by a plurality of screws 32. Flat cables 34 and 36, having stiffened ends, are suitably supported on the keyboard assembly 22 and provide the desired electrical connections between the keyboard and logic circuitry 38, suitably supported on a circuit board 39, and a conventional power supply 40 which are mounted in the bottom cover 18.

A display and controller board assembly (not shown) is secured to the keyboard assembly 22 and the keyboard frame 16 by a plurality of screws (not shown) and provides fluorescent alphanumeric display (corresponding to the results of completed calculations or to the next step to be executed in the program being utilized) through a display panel 42 which is suitably supported on the keyboard frame 16. The display and controller board assembly is also provided with a plug-type connector 44 for connection to the logic circuitry 38 and the power supply 40.

Also mounted in the bottom cover 18 are a conventional printer 46, a plurality of female connectors 48, 50 and 52 (for connection to the flat cable 34, to the flat cable 36 and, as will be explained in greater detail below, to the PROM cartridge 14, respectively) which are soldered to the circuit board 39, and a male connector 54 for connection to the connector 44 from the display and controller board assembly.

The top cover 15 has a rotatable door 56, which may be lifted to provide access to the printer 46, and a generally rectangular opening 58 near the front of the top cover 15. The opening 58 is positioned to be directly above and surrounding the location of the connector 52 when the top cover 15 has been secured in place on the bottom cover 18.

As will be explained in greater detail below, the opening 58 is keyed to insure the proper orientation of the bezel 12 when the bezel 12 is inserted into the opening 58, which is provided with rear corners 60 which have a large radius of curvature and front corners 62 which have a substantially smaller radius of curvature than the rear corners 60.

Figure 3:
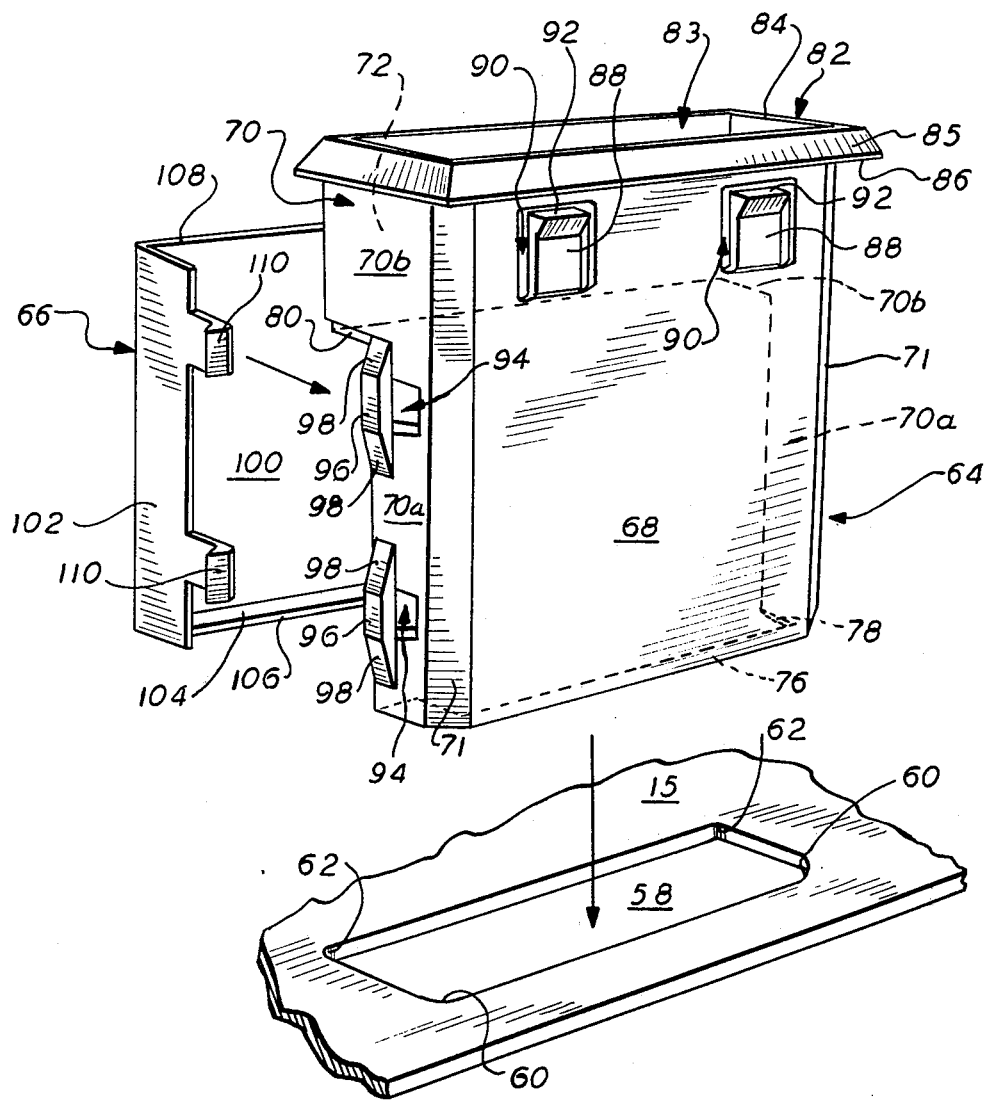
FIG. 3 is an enlarged exploded perspective, taken generally from the rear thereof, of the bezel shown in FIG. 1.

Referring now to FIGS. 1 and 3, there is shown the bezel 12 constructed in accordance with the invention and having a bezel body 64 and a bezel channel 66, both of which are molded from plastic. The bezel body 64 is generally box-shaped and has a generally rectangular planar rear member 68 and extending perpendicularly to the rear member 68 two sides 70, each having a narrow lower side portion 70a and a wider upper side portion 70b. Bevelled outer surfaces 71 are provided between the rear member 68 and the sides 70. A front face 72 is provided between the upper side portions 70b and defines a generally rectangular box, having a generally rectangular upper opening 73, adjacent the upper end of the bezel body 64 and a generally square opening 74 in the front of the bezel body 64. A generally U-shaped bottom side 76, which is narrower than the lower side portions 70a, extends perpendicularly from the rear member 68 between the lower side portions 70a and is provided with a U-shaped bevelled inner surface 78 (see FIGS. 4 and 5). The bottom edges of the upper side portions 70a and the front face 72 are provided with a U-Shaped groove 80 which defines a seat for the bezel channel 66 (as will be explained in greater detail below). The upper end of the bezel body 64 has an annular lip 82, having a flat upper end surface 84 surrounding the rectangular opening 73, inclined edges 85, and a rectangular lower edge 86 which extends outwardly beyond the rear member 68, the upper side portions 70b and the front face 72 of the bezel body 64. The rear member 68 and the front face 72 are each provided with a pair of identical molded resilient snap-tabs 88 (in openings 90) each of which has an outwardly projecting upper end 92 which is spaced from the lower edge 86 of the lip 82 by a distance which is slightly greater than the thickness of the calculator top cover 15.

Each of the lower side portions 70a of the bezel body 64 has molded therethrough a pair of rectangular openings 94 each adjacent and to the rear of a projecting rib 96 with bevelled surface 98 which extend inwardly to the outer surface of the respective lower side portion 70a. Bevelled inner surfaces 99 (only one shown in FIG. 1) are provided to the rear of the openings 94 on the inside of the bezel body 64 between the sides 70 and the rear member 68.

The bezel channel 66 has a generally square planar front member 100, a pair of sides 102 which extend perpendicularly to the front member 100 and a generally U-shaped bottom side 104, which is narrower than the sides 102 and has a bevelled U-shaped inner surface 106. The sides 102 and the front member 100 define a U-shaped upper edge 108 of the bezel channel 66, and a pair of projecting resilient snap-tabs 110 extend rearwardly from the sides 102 and are arranged to be snap fit (against the respective rib 92) in a respective rectangular opening 94 in the respective lower side portion 70a of the bezel body 64.

The bezel 12 may be simply assembled by snap-fitting the four snap-tabs 110 on the sides 102 of the bezel channel 66 into the corresponding rectangular openings 94 in the lower side portions 70a of the bezel body 64. The ribs 96 then hold the snap tabs 110 in place with the upper edge 108 of the bezel channel 66 seated in the U-shaped groove 80 on the bezel body 64 and the lower sides 76 and 104 define the rectangular opening 111 (see FIGS. 4 and 5) slightly larger than the outer dimension of the connector 52 and having a generally rectangular lower edge (formed from edges 78 and 106) which is bevelled outwardly to cause the bezel to self-align itself over connector 52.

The assembled bezel 12 may then be inserted into the opening 58 in the top cover 15 aligning the bevelled edges 71 with the corners 60, having the larger radius of curvature, and pushing the bezel 12 into the opening 58. The bevelled edges 98 on the ribs 96 permit the bezel 12 to be inserted into the opening 58 without one or more of the ribs 96 becoming engaged on the edges of the opening 58 and when the resilient snap-tabs 88 engage the edges of the opening 58, the snap-tabs 88 are urged inwardly until the upper edges 92 are disposed below the inner surface of the top cover 15, and the snap-tabs 88 return to their original positions. At this time, the lower edge 86 of the lip 82 is seated on the top cover 15 (see FIGS. 4 and 5) and the bottom edge of the bezel surrounding the opening 111 has become engaged around the connector 52.

Figure 2:
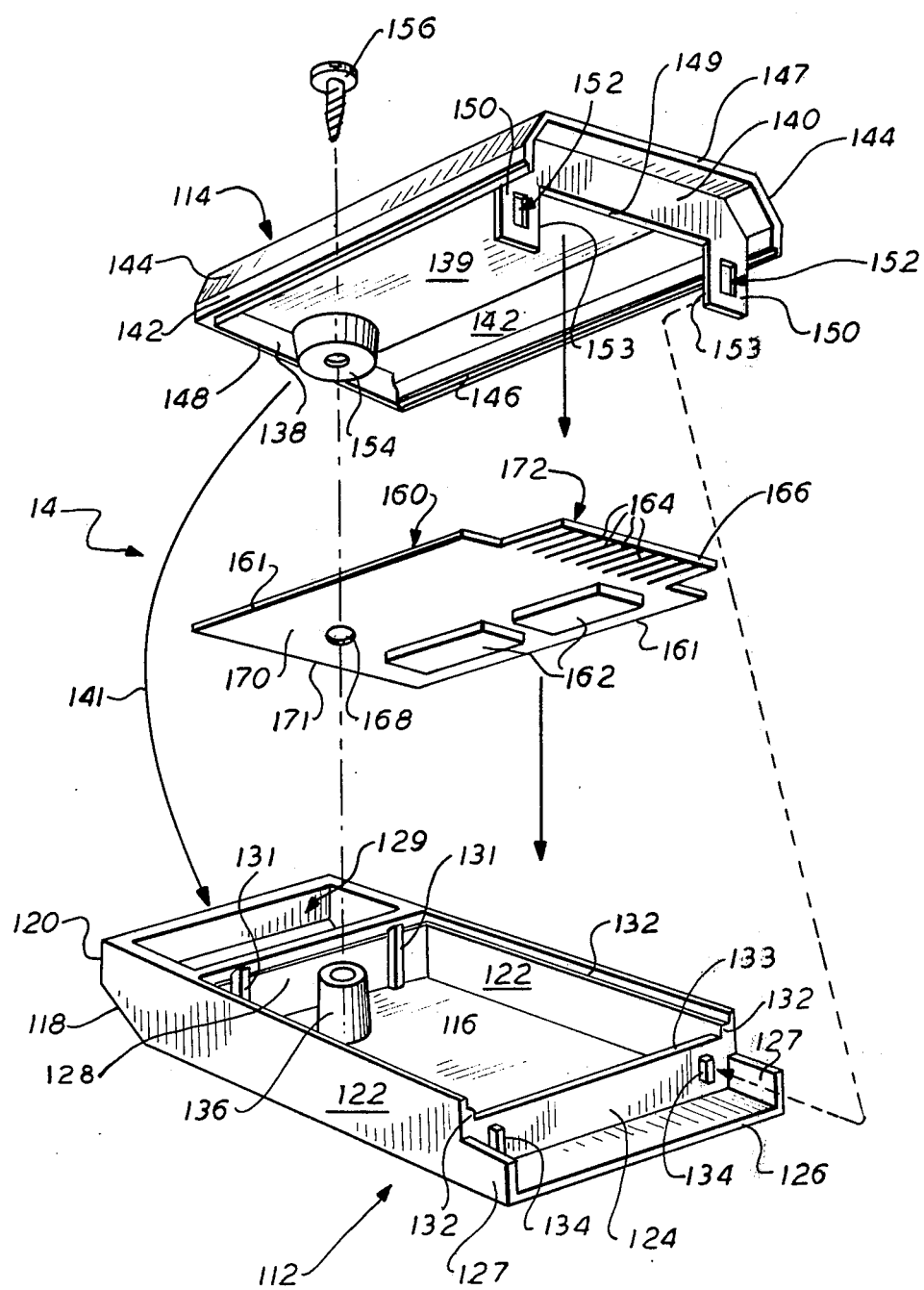
FIG. 2 is an enlarged exploded perspective view, taken generally from the bottom thereof, of the PROM cartridge shown in FIG. 1.

FIG. 2 shows an exploded perspective view of a PROM cartridge 14 constructed in accordance with the invention. The PROM cartridge 14 includes generally rectangular plastic front (or bottom) and rear (or top) housing sections 112 and 114. The front housing section 112 has a generally rectangular front member 116 and, integral with the front member 116, an inclined upper front surface portion 118 which terminates in an end wall 120 which is perpendicular to the front member 116. Side walls 122, which are integral with and perpendicular to the front member 116, extend from the end wall 120 to a lower end wall 124, which is integral with and perpendicular to the front member 116 and positioned a predetermined distance from a lower end 126 of the front member 116. The side walls 122 include narrower integral projections 127 extending from the end wall 124 to the lower end 126. A third end wall 128, integral with and perpendicular to the front member 116 and the side walls 122, is provided at the junction between the front member 116 and the front surface portion 118, defining upper and lower cavities 129 and 130 in the front housing section 112 and is provided with two parallel ribs 131 within the cavity 130. An L-shaped groove 132 is provided along the interior of the sides 122 and the end wall 128. The bottom end member 124 is narrower than the sides 122 and the end wall 124 and is provided with a pair of flanges 132 adjacent the side walls 122, an upper edge 133, and a pair of parallel rectangular ribs 134 projecting outwardly therefrom. A post 136 is disposed in the lower cavity 130 adjacent the upper end member 126.

The rear housing section 114 is provided with a generally rectangular planar rear member 139, and integral with and perpendicular to the rear member 139, an upper end wall 138, a lower end wall 140 and two side walls 142 which have bevelled outer surfaces 144. Ribs 146 and 148 extend perpendicularly from the lower surfaces of the sides 142 and the upper end wall 138, respectively, and are adapted to be seated in the groove 132 when the front and rear sections 112 and 114 are assembled with end walls 128 and 138, respectively, and side walls 122 and 142, respectively, aligned. The lower end wall 140 is spaced at a slightly greater distance from the upper end wall 138 than is the lower end wall 124 from the end wall 128 of the housing front section 112, is spaced a predetermined distance from the lower end 147 of the rear member 139, and is provided with a planar lower end 149 and a pair of rectangular projections or tabs 150 having rectangular openings 152 which are adapted to receive the ribs 134 on the lower end wall 124 of the housing front section 112. The housing rear section 114 is further provided with a hollow post 154 (having a seat—now shown—disposed in rear member 139 ) which is adapted to receive a self-tapping screw 156 and to be aligned with the post 136 when the housing front and rear sections 112 and 114 are assembled.

A printed circuit board ("PCB") 160, which has mounted thereon a plurality of PROM chips 162 (only two PROM chips 162 are shown in FIG. 2), suitably interconnected and connected to a plurality of contact ribbons 164 on a male contact end portion 106 of the PCB 160 by conventional flow soldering techniques, is provided, has a hole 168 arranged to be aligned with the holes in the posts 136 and 154 and to receive the threaded screw 156, and is sized so that the PCB 160 is supported on the post 136 at the other end portion 170 with the end 171 against the ribs 131 when the neck 172 of the contact end portion 166 rests between the tabs 150 on the edge 133 of the lower end wall 128 of the housing front section 112. The width of the PCB 160 is less than the width of the upper and lower end walls 124 and 128 of the housing front section 112 and of the upper and lower end walls 138 and 140 of the housing rear section 114, and when the ribs 134 on the end wall 124 are inserted into the openings 152 of the tabs 150 on the end wall 140 of the housing rear section 114, and the rear section 114 rotated in the direction indicated by the solid arrow 141 until the upper end wall 138 is aligned with the end wall 128 of the front section 112, the ribs 146 and 148 are disposed in the groove 132 between the sides 122 and end wall 128, respectively, of the housing front section 112, and the edges 161 and 171 of the PCB 160, aligning the PCB 160 within the front and rear sections 112 and 114. The ribs 146 and 148 also cooperate with the end wall 128 and the side walls 122 of the housing front section 112 and the groove 132 to align the front and rear sections 112 and 114. The screw 158 then may be threaded via the post 154 and the hole 168 into the post 136 (with the head of the screw 156 recessed in its seat) to secure the cartridge 14. With the cartridge 14 assembled, the inner, opposed edges 153 of the ribs 150, the edge 149 of the end member 140, and the upper edge 133 and the flanges 132 of the end wall 124 cooperate to define a narrow rectangular opening which further constrains movement of the contact end portion 166 and the PCB 160.

The assembled PROM cartridge 14 may then be inserted into the opening 73 defined by the bezel 12 by aligning the bevelled edges 144 on the cartridge 14 with the bevelled inner surfaces 99 within the bezel 12 and pushing the cartridge 14 into the opening 73 as shown in FIGS. 4 and 5. The cartridge 14 may be guided into place by placing the thumb of one hand on the inclined surface portion 118 and one or more fingers in the cavity 129 and urging the cartridge 14 down into the opening 73. When the cartridge 14 is fully inserted in place, the contact end portion 166 of the PCB 160 is disposed within a receptacle 172 in the connector 52 and has established a reliable electrical connection with the connector 52. The lower ends 126 and 147 of the housing front and rear sections 112 and 114, respectively, act as stops to prevent further insertion of the cartridge 14 into the opening 73, thereby preventing damage to the PCB contact end portion or to the connector 52.

The PROM cartridge 14 may be removed simply by grasping the inclined surface portion 118 and the cavity 129, as described above, and lifting the PROM cartridge 14 out of the bezel 12. Likewise, the bezel 12 may be removed by removing the calculator top cover 15, thereby disengaging the lower end of the bezel 12 from around the connector 52, and by urging all four snap-tabs 88 inwardly until the upper end surfaces 92 are clear of the top cover 15 and lifting or pushing the bezel 12 up relative to the top cover 15 until the bezel 12 is removed from the opening 58.

Thus, it will be readily appreciated a cartridge and bezel arrangement constructed in accordance with the present invention provides a simple, inexpensive and reliable mechanism for connection of a PROM cartridge to a calculator. The cartridge parts and bezel parts are self-aligning and both the cartridge 14 and bezel 12 are easily assembled. No hand-soldering is required for the cartridge 14 and proper insertion of the bezel 12 into the calculator 10 and of the PROM cartridge 14 into the connector 52 is insured.

While the invention has been described with reference to a particular embodiment thereof, it will be appreciated that various modifications therein in form and detail may be within the spirit and scope of the appended claims.

What is claimed is:

1. In a calculator comprising:

a housing having a first opening in the surface thereof, said first opening having at least one first inner surface portion having a substantially larger first radius of curvature than the second radii of curvature of the other, second inner surface portions of said first opening; and a connector having an outer surface and being disposed within the housing and rendered accessible from the exterior of the housing via the first opening for electrically connecting to the calculator circuitry disposed on a medium which is separate from the calculator;

the improvement comprising:

guide means having a cross-section which is sustantially the same shape as the first opening and is slightly smaller than the size of the first opening, said guide means being separate from the housing and insertable within the first opening for guiding the medium, during insertion thereof, through the first opening into effective electrical connection with the connector, the guide means defining at its inner end a second, inner opening which is the same shape as the outer surface of the connector and is slightly larger than the outer dimension of the connector, said guide means having first keying means comprising at least one of the outer surface portions of the guide means which corresponds to the first inner surface portion of the first opening and defines a bevelled surface, said guide means being insertable through the first opening only when the bevelled surface is aligned with the first inner surface portion of the first opening, said guide means further comprising second keying means for preventing the medium from being inserted through the first opening in other than a preferred orientation, said guide means further including means for snap-fitting the guide means within the first opening with the second, inner opening of the guide means engaging the outer surface of the connector when the guide means is inserted through and snap fit in the first opening, whereby the guide means remains fixed relative to the housing and the connector after the guide means is inserted into the first opening.

2. A calculator according to claim 1 wherein the guide means, after insertion thereof through the first opening, defines a third opening within and having the same shape as the first opening, and has an inner surface with at least one bevelled surface portion, and the medium has a generally cross-section which has the same shape as and is slightly smaller than the third opening, at least one of the outer surface portions of the medium defining a bevelled surface portion, the medium being insertable into the third opening only when the bevelled surface portion of the medium is aligned with the bevelled surface of the third opening.

3. A calculator according to claim 2 wherein the guide means further comprises:

a lip, having an annular cross-section and an outer dimension which is greater than the outer dimension of the first opening, defining the outer end of the guide means, and at least one resilient snap-tab formed in an opening in at least one outer surface of the guide means and having an outer end surface facing and spaced-apart from the lower surface of the lip by a distance which is slightly greater than the thickness of the housing, the lower surface of the lip and the end surface of the snap tab cooperating to define the means for snap-fitting the guide means within the first opening when the guide means is inserted in the first opening with the lower surface of the lip disposed adjacent the housing.

4. A calculator according to claim 3 wherein the medium comprises a cartridge including:

an electronic circuit mounted on a printed circuit board having located at one end margin of the printed circuit board a set of terminals of the circuit;

a cartridge housing having top and bottom covers, each of the covers having a front and a rear end wall and spaced-apart side walls;

means, disposed on one of the top and bottom covers, for supporting the printed circuit board in the one cover; and means, disposed on one of the top and bottom covers, for aligning the side walls and one of the front and rear end walls of the bottom cover with the respective side walls and the respective one of the front and rear end walls of the top cover and for aligning the printed circuit board within the bottom and top covers when the top and bottom covers are assembled, the other of the respective front and rear walls of the top and bottom covers being arranged to cooperate to support the one end margin of the printed circuit board when the top and bottom covers are assembled.

5. A calculator according to claim 4 wherein the first, second and third openings, the cross-section and inner surface of the guide means, and the lip are substantially rectangular.

6. A read-only memory cartridge for controlling at least one function of an electronic calculator, the cartridge comprising:

an electronic circuit mounted on a printed circuit board having located at one end margin of the printed circuit board a set of terminals of the circuit;

a cartridge housing having top and bottom covers, each of the covers having a front and a rear end wall and spaced-apart side walls, wherein the one end wall and the side walls of the bottom cover each have a groove disposed in their respective interiors and cooperate to define a U-shaped groove within the bottom cover;

means, disposed on the bottom cover for supporting the printed circuit board in the bottom cover with at least one edge of the printed circuit board spaced apart from and generally in parallel relationship with one side of the U-shaped groove; and at least one rib extending from one of the one end wall and side walls of the top cover for aligning the side walls and one of the front and rear end walls of the bottom cover with the respective side walls and the respective one of the front and rear end walls of the top cover and for aligning the printed circuit board within the bottom and top covers when the top and bottom covers are assembled, said rib being positioned for insertion into at least a portion of the U-shaped groove between at least one wall of the bottom cover and at least one edge of the printed circuit board when the top and bottom covers are assembled, the other of the respective front and rear walls of the top and bottom covers being arranged to cooperate to support the one end margin of the printed circuit board when the top and bottom covers are assembled, whereby the rib aligns the respective walls of the top and bottom covers and aligns the printed circuit board within the top and bottom covers.

7. A cartridge according to claim 6 wherein the other end wall of the one of the top and bottom covers extend in an overlapping relationship outside the respective other end wall of the other of the top and bottom covers when the top and bottom covers are assembled and further comprises:

means for engaging at least a portion of the respective other end wall of the other of the top and bottom covers.

8. A cartridge according to claim 7 wherein the other end wall of the other of the top and bottom covers has at least one rib projecting exteriorly thereof and the means for engaging comprises an opening disposed in a tab for receiving the rib, the tab projecting from the other end wall of the one of the top and bottom covers in the direction of the overlapping relationship.

9. A cartridge according to claim 7 wherein at least one of the top and bottom covers further comprises means, rigid with the cover, extending beyond the one end margin of the printed circuit board.

10. A cartridge according to claim 9, wherein one of the top and bottom covers further comprises a cavity, disposed exteriorly of the housing, for supporting the cartridge after assembly thereof.

11. A cartridge according to claim 10 wherein the top and bottom covers and the printed circuit board further comprise means for securing the cartridge in assembled relationship with a single connector.

* * * * *

UNITED STATES PATENT AND TRADEMARK OFFICE
CERTIFICATE OF CORRECTION

PATENT NO. : 4,323,979
DATED : April 6, 1982
INVENTOR(S) : John N. Johnston

It is certified that error appears in the above—identified patent and that said Letters Patent is hereby corrected as shown below:

In the Abstract

In the second sentence, after the phrase "prevent improper orientation" delete the word "on" and substitute therefor the word --of--.

In the Description of the Preferred Embodiment

In Col. 2, line 22, delete "keyboad" and substitute therefor the word --keyboard--.

In Col. 3, line 42, delete "surface" and substitute therefor the word --surfaces--.

In Col. 4, line 6, after the phrase "top cover 15" insert the word --by--.

In Col. 5, line 5, delete "now" and substitute therefor the word --not--.

Signed and Sealed this

Twelfth Day of October 1982

[SEAL]

Attest:

GERALD J. MOSSINGHOFF

Attesting Officer   Commissioner of Patents and Trademarks